United States Patent
Kim

(10) Patent No.: US 7,053,408 B2
(45) Date of Patent: May 30, 2006

(54) LIQUID CRYSTAL DISPLAY DEVICE HAVING ENLARGED CHANNEL REGION AND FABRICATING METHOD THEREOF

(75) Inventor: Ik Soo Kim, Kumpo-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 39 days.

(21) Appl. No.: 09/893,976

(22) Filed: Jun. 29, 2001

(65) Prior Publication Data
US 2002/0085139 A1 Jul. 4, 2002

(30) Foreign Application Priority Data
Dec. 30, 2000 (KR) .............................. P2000-87051

(51) Int. Cl.
*H01L 21/00* (2006.01)
(52) U.S. Cl. ............................... 257/72; 257/59
(58) Field of Classification Search .............. 349/43, 349/46; 438/158, 163; 257/57, 348, 72, 257/59
See application file for complete search history.

(56) References Cited

U.S. PATENT DOCUMENTS

| RE33,829 E | * | 2/1992 | Castleberry | 345/92 |
| 5,150,181 A | * | 9/1992 | Takeda et al. | 257/57 |
| 5,576,555 A | * | 11/1996 | Yamanobe et al. | 257/53 |
| 5,705,411 A | * | 1/1998 | Yamanobe et al. | 438/158 |
| 5,710,606 A | * | 1/1998 | Nakajima et al. | 349/42 |
| 5,777,703 A | * | 7/1998 | Nishikawa | 349/47 |
| 5,789,791 A | * | 8/1998 | Bergemont | 257/401 |
| 6,239,468 B1 | * | 5/2001 | Chang et al. | 257/347 |
| 6,509,946 B1 | * | 1/2003 | Kodate | 349/141 |
| 6,545,291 B1 | * | 4/2003 | Amundson et al. | 257/40 |

FOREIGN PATENT DOCUMENTS

JP 02058030 A * 2/1990

* cited by examiner

Primary Examiner—Laura M. Schillinger
(74) Attorney, Agent, or Firm—McKenna Long & Aldridge LLP

(57) ABSTRACT

A liquid crystal display, and a fabricating method thereof, having TFTs with specially shaped channels produced by protrusions on source and drain electrodes.

17 Claims, 14 Drawing Sheets

LIQUID CRYSTAL DISPLAY DEVICE HAVING ENLARGED CHANNEL REGION AND FABRICATING METHOD THEREOF

CROSS REFERENCE

This application claims the benefit of Korean Patent Application No. P00-87051, filed 30 Dec. 2000, under 35 U.S.C. §119, the entirety of which is hereby incorporated by reference.

BACKGROUND OF THE INVENTION

1. Field of the Invention

This invention relates to a liquid crystal display device, and more particularly to a liquid crystal display device that is adaptable for use in large, high picture quality displays. The present invention also is directed to a method of fabricating such a liquid crystal display device.

2. Description of the Related Art

Generally, an active matrix liquid crystal display (LCD) uses thin film transistors (TFT's) as switching devices to produce a natural-looking moving picture. Since such LCDs can be made smaller than existing Cathode Ray Tube (CRT) displays, they have become widely used as monitors for devices such as personal computers, notebook computers, office equipment, cellular phones, and pagers.

Referring now to FIG. 1, which is a plan view showing a partial structure of a conventional liquid crystal display device, that LCD includes a TFT that is arranged extended from the intersection of a data line 4 and a gate line 2 to a portion of the data line 4. A pixel electrode 22 is connected to the drain electrode 10 of the TFT.

The TFT includes a gate electrode 6 that is connected to the gate line 2, a source electrode 8 that is connected to the data line 4, and the drain electrode 10. The source electrode 8 projects over the gate line 2 and is a part of the data line 4. The data line 4 is applied with a gap to the semiconductor layer 14 and 16. The drain electrode 10 and the pixel electrode 22 are connected together via a contact hole 20. The TFT also includes semiconductor layers 14 and 16 that define a channel 24 between the source electrode 8 and the drain electrode 10 when a gate voltage is applied to the gate electrode 6. Referring now to FIG. 2, the channel 24 typically has a length L of about 5 to 6 µm and a width W of about 25 µm. Referring now back to FIG. 1, the channel is arranged along the data line 4 so as to increase the ON current. In operation, a TFT responds to a gate signal on the gate line 2 by selectively applying a data signal on the data line 4 to the pixel electrode 22.

In practice, an LCD includes a plurality of TFTs and pixel electrodes 22. Each pixel electrode 22 is positioned in a cell area defined between data lines 4 and gate lines 2. The pixel electrodes are comprised of a transparent conductive material. Each pixel electrode 22 can produce a potential difference with a common transparent electrode (not shown) provided on an upper substrate (not shown). By way of a potential difference, a liquid crystal positioned between the lower substrate 1 (not shown) and the upper substrate (not shown) is rotated due to dielectric anisotropy in the liquid crystal. Thus, a molecular arrangement of the liquid crystal varies according to the voltage that is applied to each pixel electrode. As a result, the light transmission through the liquid crystal display varies pixel by pixel such that video information is displayed.

FIG. 3A to FIG. 3E are plan views and sectional views, taken along line a–a' of FIG. 1, which are useful for explaining a method of fabricating an LCD device as shown in FIG. 1. Referring first to FIG. 3A, the gate line 2 and the gate electrode 6 are provided on a substrate 1. The gate electrode 6 is formed by depositing a metal, such as aluminum (Al) or copper (Cu), such as by sputtering, and then etching to form the gate line and gate electrode.

Referring now to FIG. 3B, an active layer 14 and an ohmic contact layer 16 are then fabricated on a gate insulating film 12 formed on the gate line 2 and the gate electrode 6. The gate insulating film 12 is typically formed by depositing an insulating material, such as silicon nitride ($SiN_x$) or silicon oxide ($SiO_x$), by plasma enhanced chemical vapor deposition (PECVD). The active layer 14 is then fabricated from undoped amorphous silicon, while the ohmic contact layer 16 is formed from amorphous silicon that is heavily doped with an n-type or p-type impurity. The active layer 14 and the ohmic contact layer 16 are fabricated by deposition and subsequent patterning using chemical etching.

Referring now to FIG. 3C, the data line 4, the source electrode 8 and the drain electrode 10 are then provided on the gate insulating film 12. The data line 4 and the source and drain electrodes 8 and 10 are typically made from chrome (Cr) or molybdenum (Mo). The source electrode 8 projects over the gate line 2 and is a part of the data line 4. The data line 4 and the source and drain electrodes 8 and 10 are formed by first depositing a metal layer (i.e., Cr or Mo) using chemical vapor deposition or sputtering and then patterning that metal layer. After the data line 4, source electrode 8, and drain electrode 10 are formed, the ohmic contact layer 16 over the gate electrode 6 is patterned to expose the active layer 14. The area over the gate electrode 6 between the source and drain electrodes 8 and 10 in the active layer forms a channel 24.

Referring to FIG. 3D, a protective layer 18 and a contact hole 20 are then added to the structure. The protective layer 18 and the contact hole 20 are formed by depositing an insulating material over the exposed surface. The protective layer is then patterned to form the contact hole 20 that exposes the drain electrode. The protective layer 18 is beneficially made from an inorganic insulating material such as silicon nitride ($SiN_x$) or silicon oxide ($SiO_x$), an acrylic organic compound, or an organic insulating material having a small dielectric constant such as Teflon, BCB (benzocyclobutene), Cytop or PFCB (perfluorocyclobutane).

Referring now to FIG. 3E, a pixel electrode 22 is then formed on the protective layer 18. The pixel electrode 22 is formed by depositing a transparent conductive material, such as indium-tin-oxide (ITO), indium-zinc-oxide (IZO) or indium-tin-zinc-oxide (ITZO), on the protective layer 18 and into the contact hole 20. The transparent conductive layer is then patterned. The pixel electrode 22 is electrically connected, via the contact hole 20, to the drain electrode 10.

In such LCD devices, the gate electrode 6 extends along the data line 4, as shown in FIG. 1, so as to enlarge the channel 24. When a typical photo resist pattern is used to fabricate an extended gate electrode 6, the uniformity of the resulting gate electrode is not particularly good as the photo resist deteriorates during fabrication. The result can be a defective gate electrode and consequent reduced manufacturing throughput. Additionally, an LCD device having an extended gate electrode has a problem in that, since the TFT area extends along the data line to correspond to the lengthy gate electrode, the display area has a reduced aperture ratio.

In addition, as the overlapping area A of the gate electrode 6 and the data line 4 increases (see FIG. 1), the parasitic capacitance Cgs, which is proportional to the overlapping area A, increases. A large parasitic capacitance Cgs can cause flicker and a residual image, both of which reduce picture quality. Also, a large parasitic capacitance reduces the speed of response such that acceptable large-dimension LCDs are not possible.

SUMMARY OF THE INVENTION

Accordingly, it is an object of the present invention to provide a liquid crystal display device, and a fabricating method thereof, that are adaptive for high quality, large dimension liquid crystal display devices.

In order to achieve that and other objects of the invention, a liquid crystal display device according to one aspect of the present invention includes a gate electrode on a substrate; a gate insulating film on the substrate and over the gate electrode; a semiconductor layer on the gate insulating layer and over the gate electrode; source and drain electrodes formed on the semiconductor layer, wherein each of those electrodes includes a protrusion that extends toward the other electrode and over the semiconductor layer; a protective layer on the gate insulating film and over the source and drain electrodes; and a pixel electrode on the protective layer.

The semiconductor layer has a "コ"-shaped channel formed along the source and drain electrodes. The semiconductor layer includes an active layer formed on the gate insulating film, and an ohmic contact layer formed on the active layer and provided with a "コ"-shaped opening corresponding to the shape of the channel.

The channel beneficially has a width of more than 50 μm.

A method of fabricating a liquid crystal display device according to the principles of the present invention includes the steps of forming a gate electrode on a substrate; forming a gate insulating film on the substrate and over the gate electrode; forming a semiconductor layer on the gate insulating film and adjacent the gate electrode; forming source and drain electrodes on the semiconductor layer such that at least one protrusion projects from each electrode toward the other electrode, forming a protective layer on the gate insulating film and over the source and drain electrodes; and forming a pixel electrode on the protective layer. Beneficially, the semiconductor layer forms a TFT having a channel that follows the area between the source and drain electrodes. Furthermore, a "コ" shaped channel is formed.

BRIEF DESCRIPTION OF THE DRAWINGS

The principles of the present invention will be apparent from the following detailed descriptions of an embodiment of the present invention, and with reference to the accompanying drawings, in which.

DETAILED DESCRIPTION OF THE PREFERRED EMBODIMENT

Figure 4:
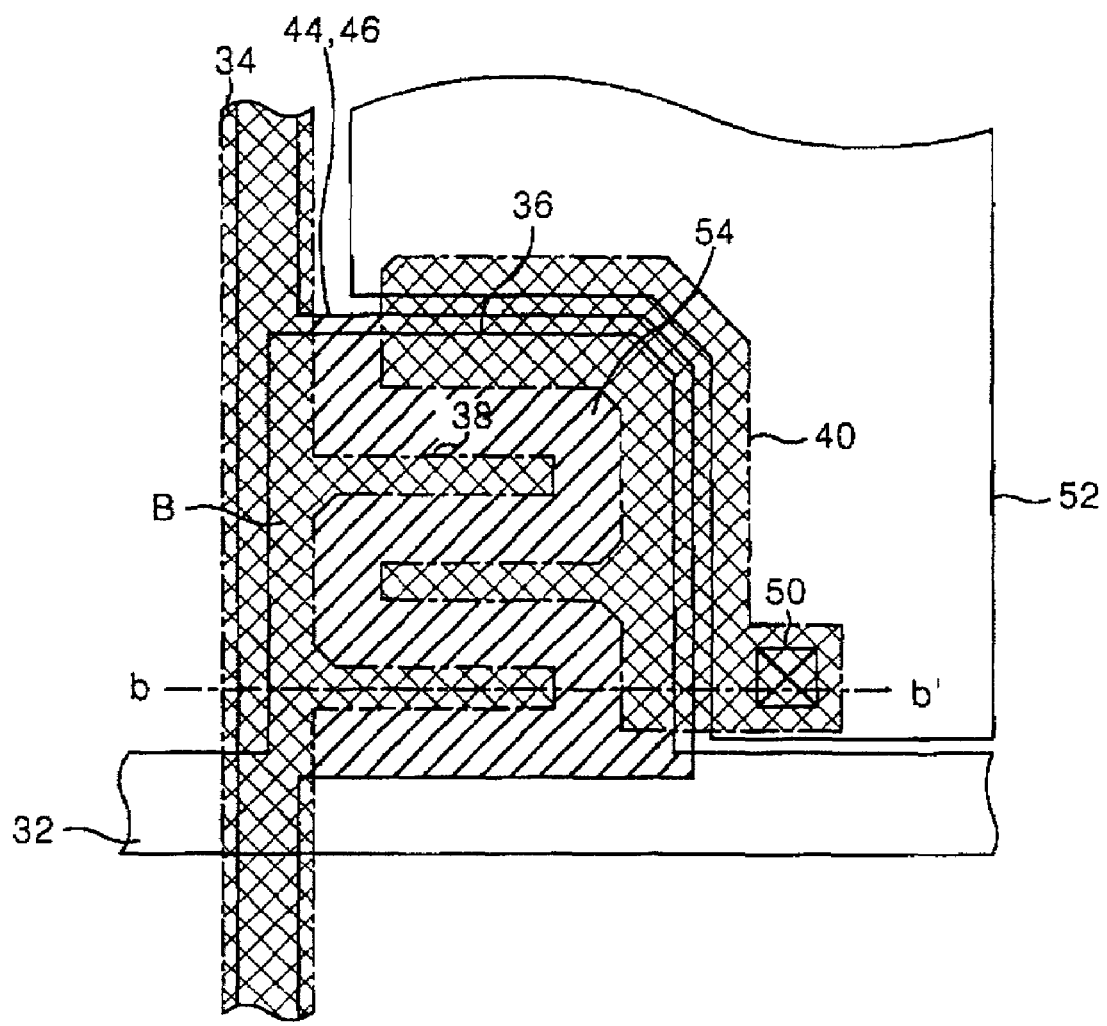
FIG. 4 is a plan view showing a structure of a liquid crystal display device according to an embodiment of the present invention.

Refer now to FIG. 4 for a plan view of a partial structure of an LCD according to the principles of the present invention. On a lower substrate (element 31, shown in FIGS. 6A–6E) is a TFT arranged near an intersection of a data line 34 and a gate line 32. Also shown is a pixel electrode 52, which connects to a drain electrode 40 of the TFT.

The TFT includes a gate electrode 36 that is connected to the gate line 32, a source electrode 38 that is connected to the data line 34, and the drain electrode 40, which connects via a contact hole 50 to the pixel electrode 52. The TFT also includes semiconductor layers 44 and 46 that define a conductive channel 54 between the source electrode 38 and the drain electrode 40 when a gate voltage is applied to the gate electrode 36. As shown in FIG. 4, the source electrode 38 and the drain electrode 40 are each formed with at least one protrusion such that the channel 54 has the shape shown in FIG. 5.

Figure 1:
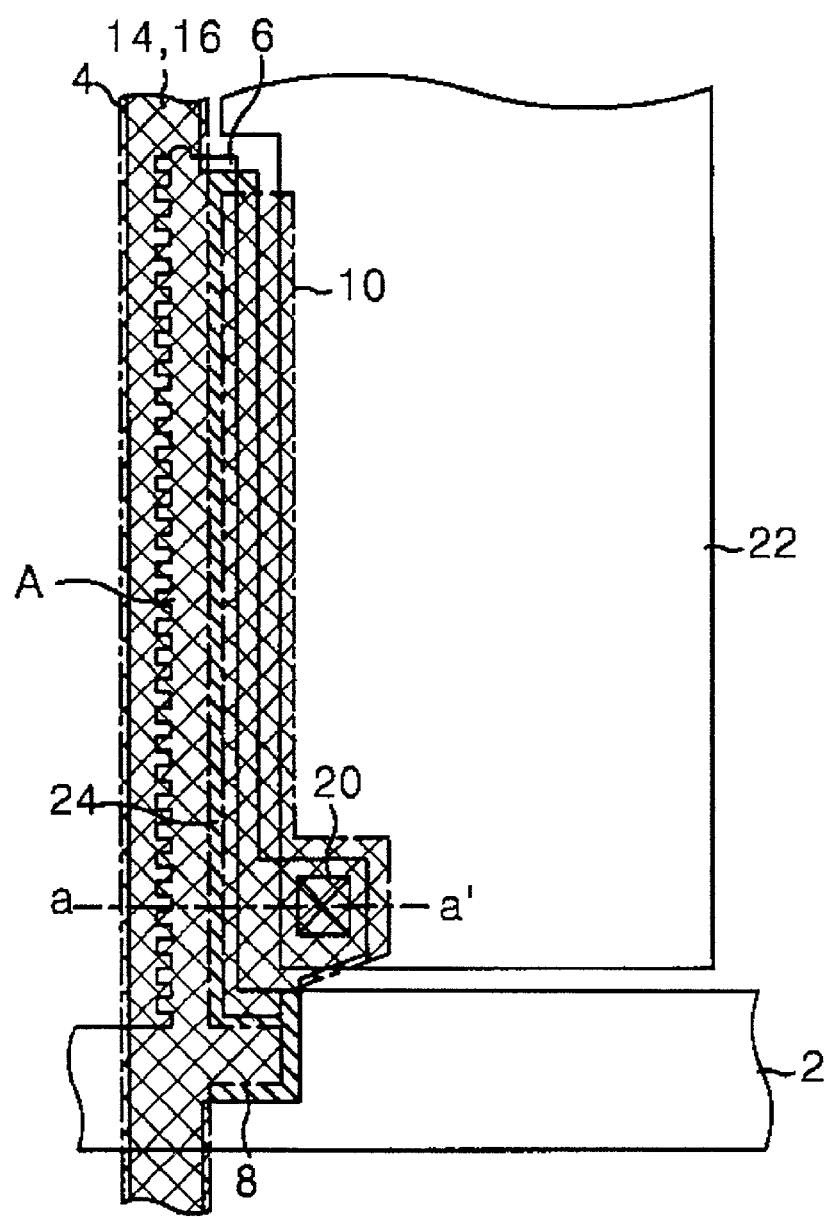
FIG. 1 is a plan view showing a partial structure of a conventional liquid crystal display device.
Figure 2:
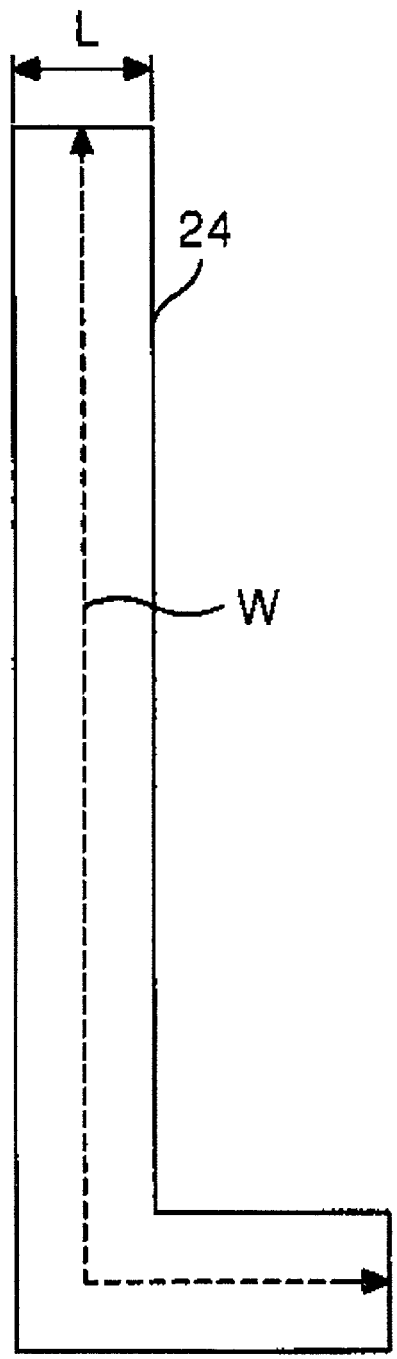
FIG. 2 is a plan view of the channel of FIG. 1.
Figure 3A:
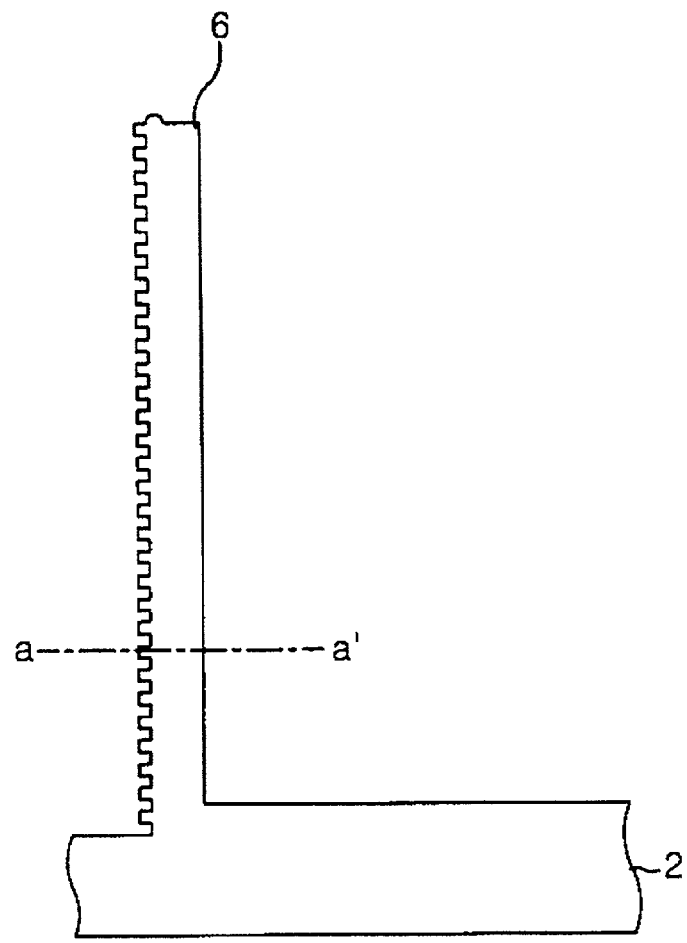
FIG. 3A to FIG. 3E are plan views and sectional views, along line a—a, of the liquid crystal display device shown in FIG. 1.
Figure 3A:
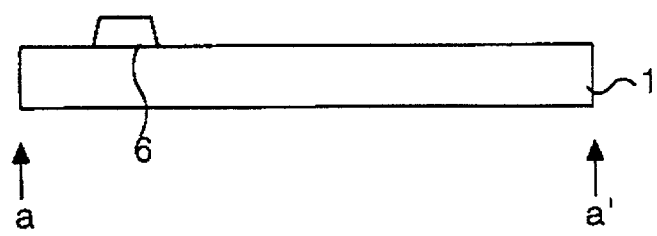
Figure 3B:
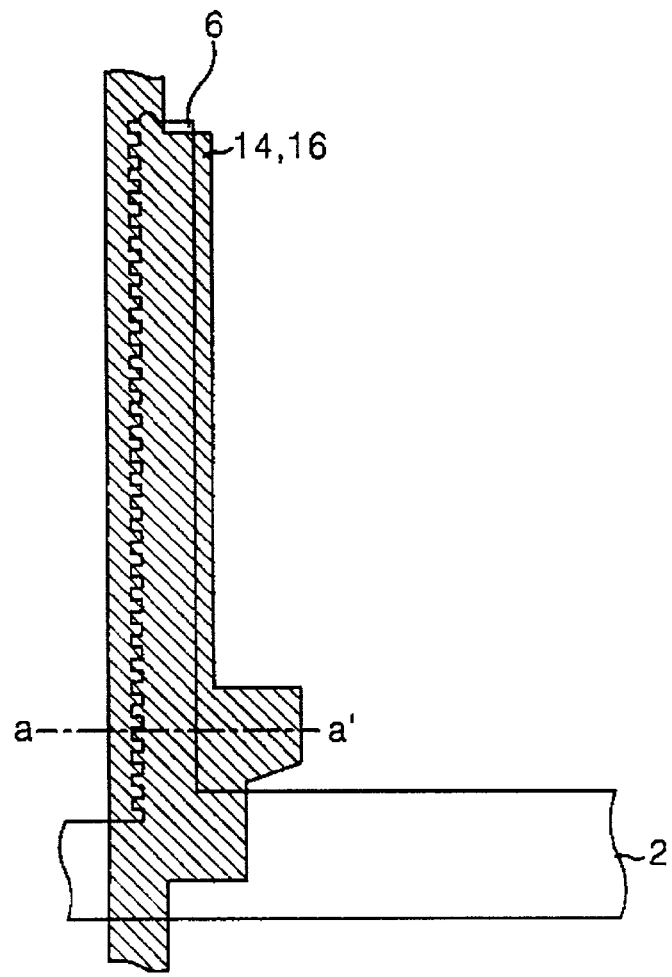
Figure 3B:
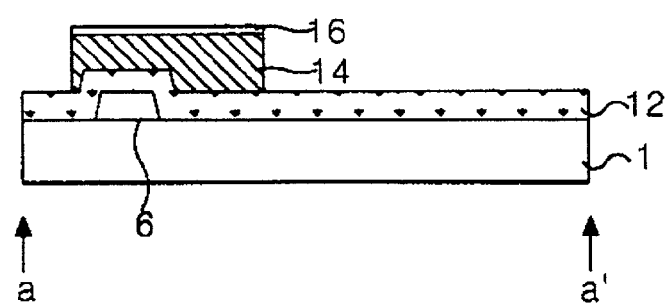
Figure 3C:
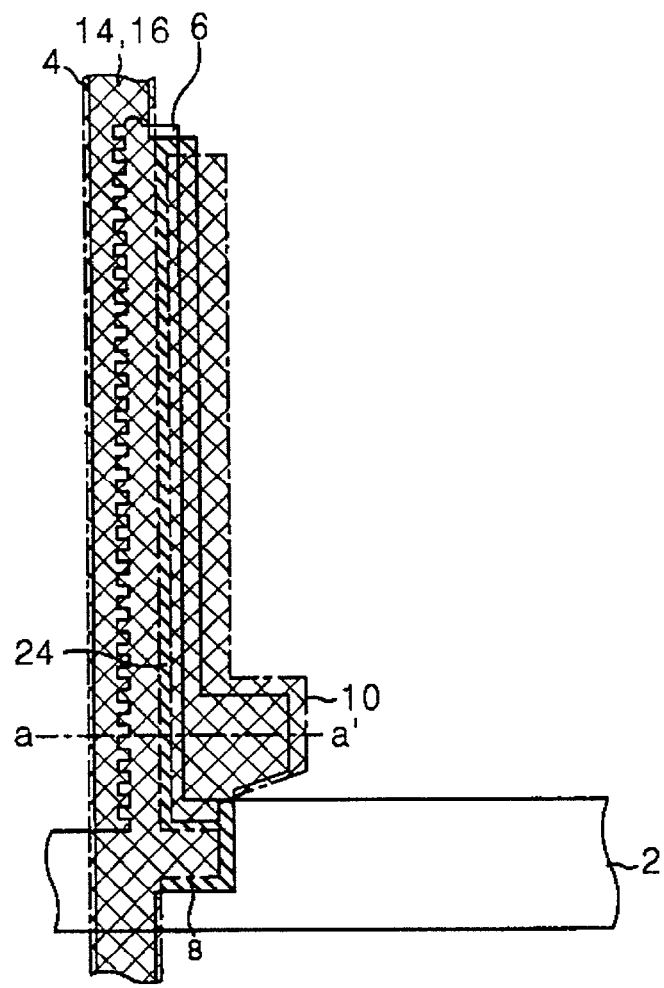
Figure 3C:
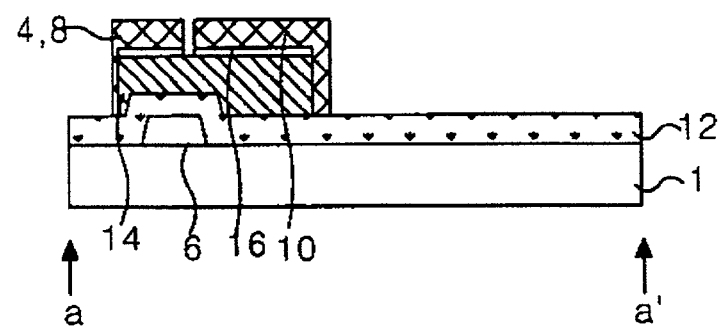
Figure 3D:
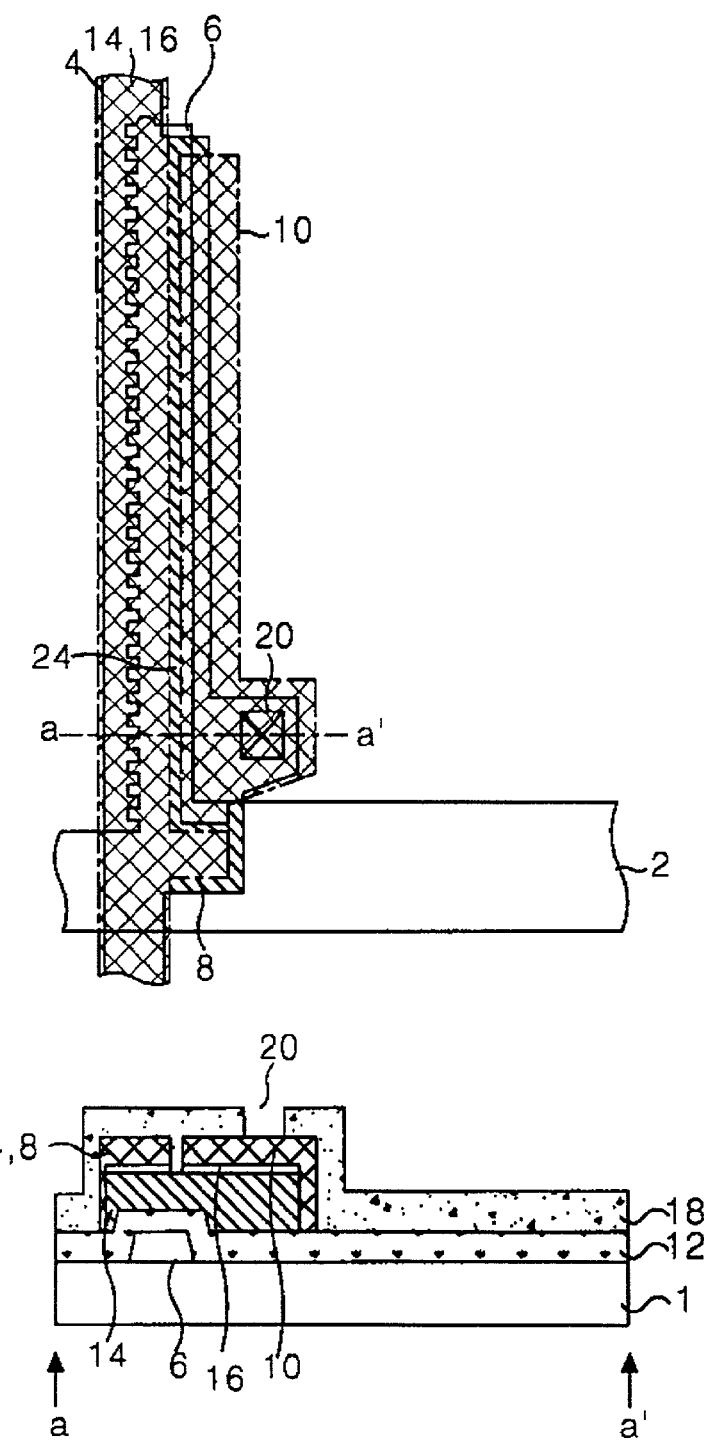
Figure 3E:
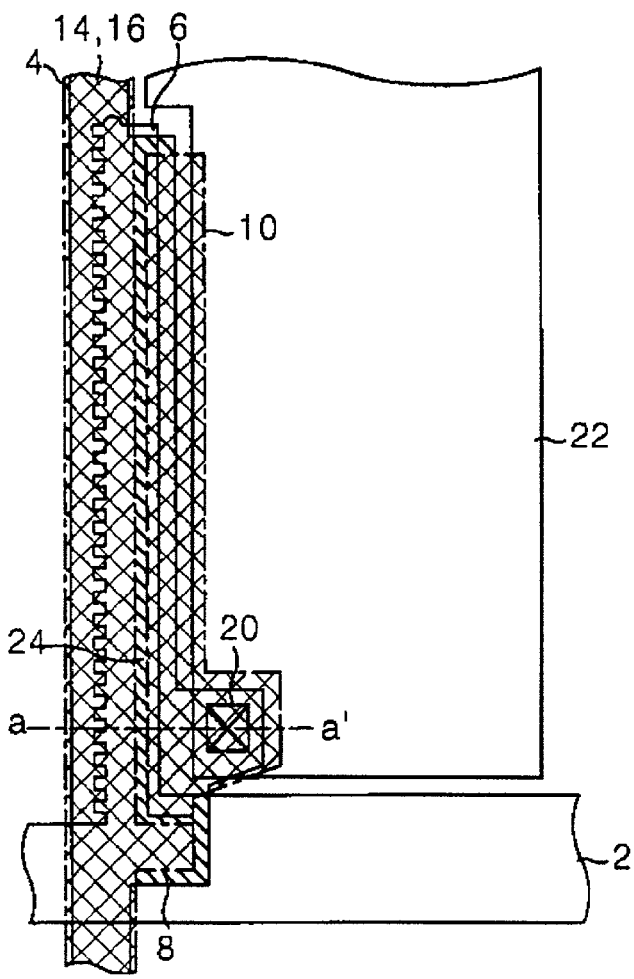
Figure 3E:
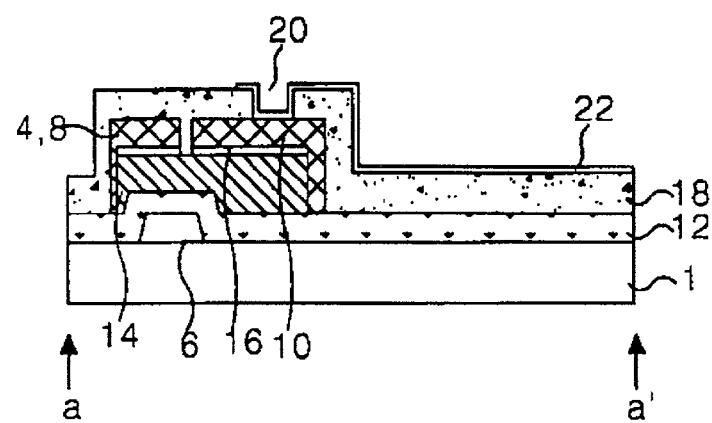
Figure 5:
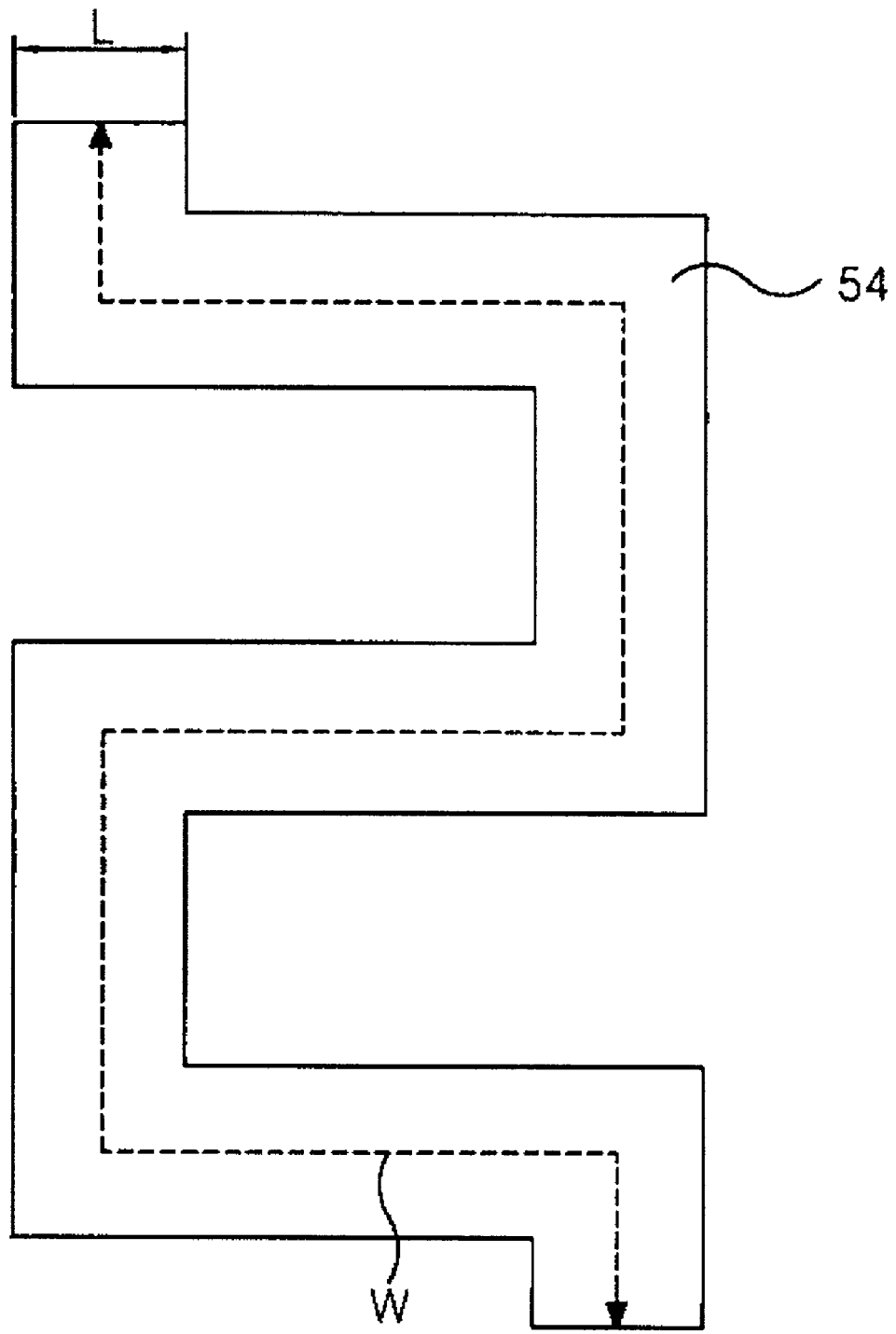
FIG. 5 is a plan view of the channel of FIG. 4.

Referring now to FIG. 5, the channel 54 is fabricated with a width W of about 50 to 100 μm and with a length L of about 4 to 6 μm. The length L of the channel 54 is beneficially equal to or less than that of the channel in the prior art (see FIG. 2) while its width W is beneficially greater (by more than 25 μm) than that of the prior art channel. In other words, the width W of the channel 54 is increased. Furthermore, by forming a channel as shown in FIG. 5, the overlapping area B between the source electrode 38 and the gate metal layers (32 and 36) can be reduced.

The TFT responds to gate signals on the gate line 32 so as to selectively apply a data signal on the data line 34 to the pixel electrode 52. Of course, in practice an LCD includes a plurality of TFTs and pixel electrodes. The pixel electrodes 52 are individually positioned in cells defined by data lines 34 and gate lines 32. The pixel electrodes are made from a transparent conductive material, each pixel electrode 52 can produce a potential difference with a common transparent electrode (not shown) on an upper substrate (not shown) when a data signal is applied to that electrode through a contact hole 50. A liquid crystal positioned between the lower substrate and the upper substrate is rotated due to its dielectric anisotropy by this potential difference. Thus, the liquid crystal selectively allows light from a light source to pass through the pixel electrode 52 to the upper substrate.

FIG. 6A to FIG. 6E are plan views and sectional views taken along line b–b' of FIG. 4. Those view are useful for explaining a method of fabricating an LCD device according to FIG. 4.

Figure 6A:
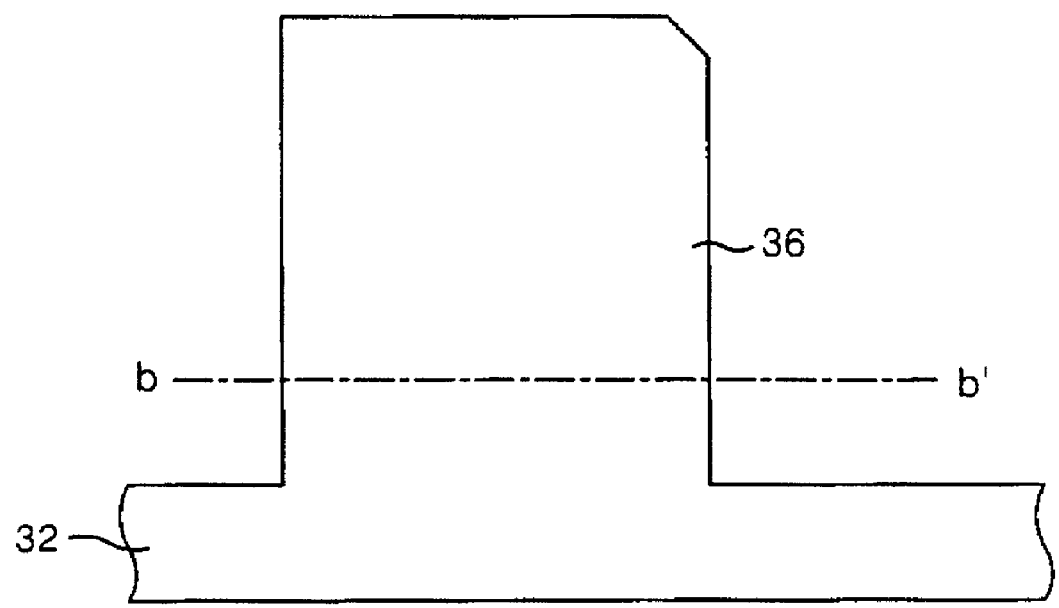
FIG. 6A to FIG. 6E are plan views and sectional views, along line b–b', of the liquid crystal display device shown in FIG. 4.
Figure 6A:
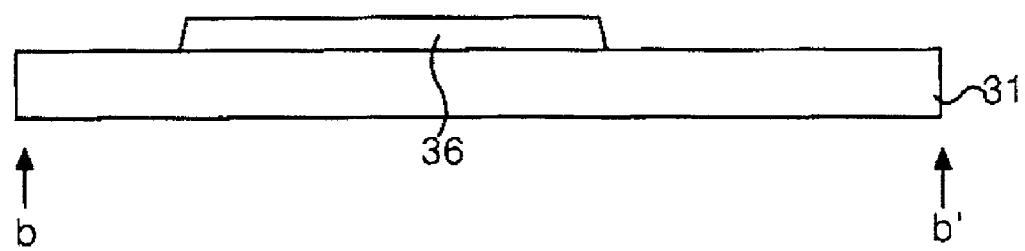

Referring first to FIG. 6A, the gate line 32 and the gate electrode 36 are formed on the substrate 31. Those elements are formed by depositing aluminum (Al) or copper (Cu), such as by sputtering, and then patterning the deposited layer to form the gate line 32 and the gate electrode 36.

Figure 6B:
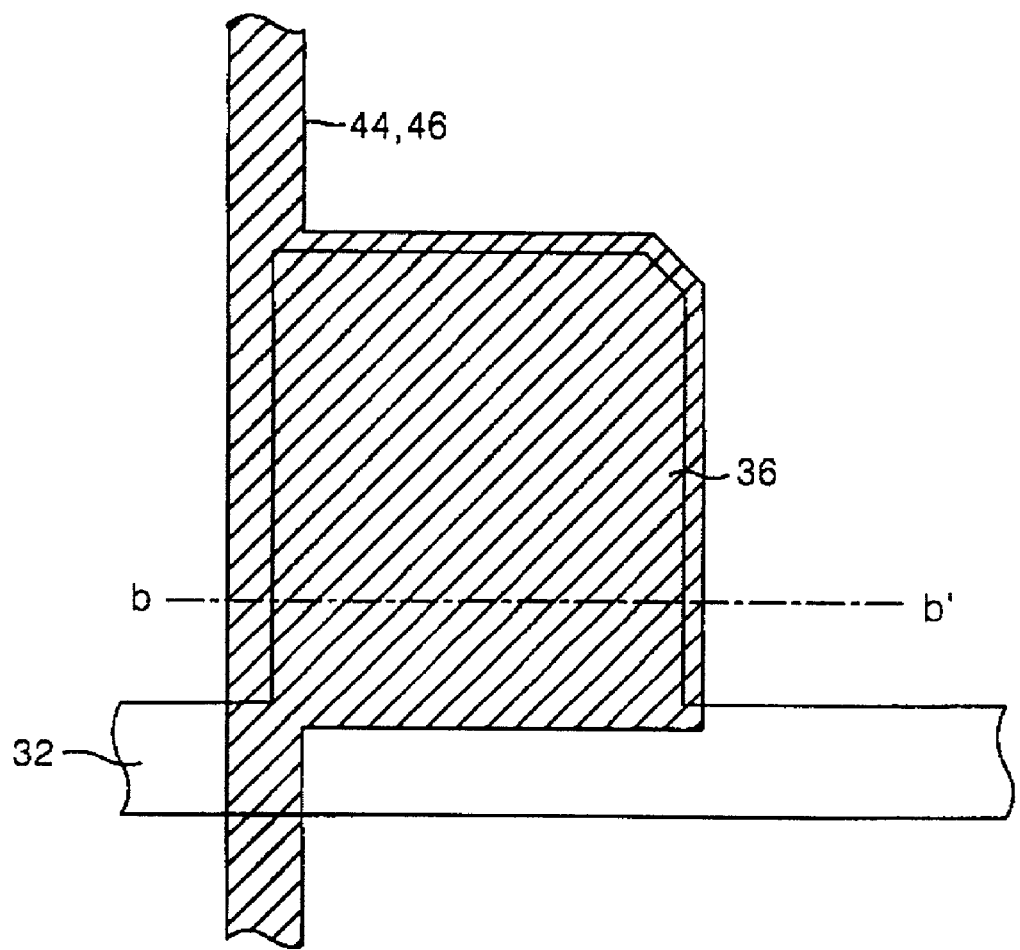
Figure 6B:
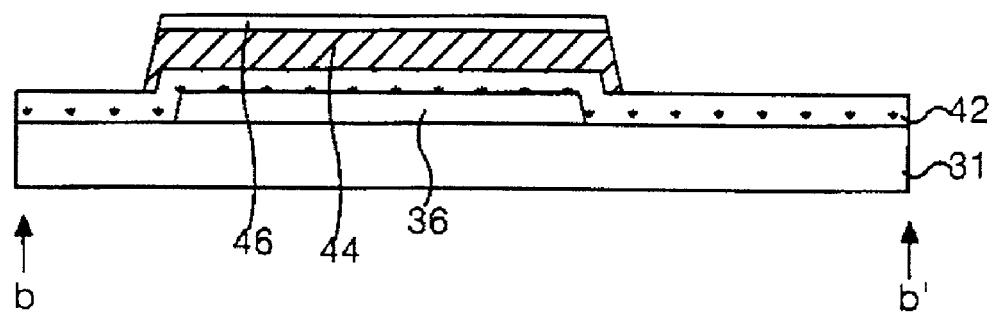

Referring now to FIG. 6B, an active layer 44 and an ohmic contact layer 46 are then formed on a gate insulating film 42. The gate insulating film 42 is produced first, beneficially by depositing an insulating material, such as silicon nitride ($SiN_x$) or silicon oxide ($SiO_x$), on the substrate 31 and over the gate electrode 36. Typically, deposition is by plasma enhanced chemical vapor deposition (PECVD). The active layer 44 is then formed by depositing undoped amorphous silicon, and then the ohmic contact layer 46 is formed from depositing amorphous silicon that is heavily doped with an n-type or p-type impurity. The active layer 44 and the ohmic contact layer 46 are then completed by chemical etching.

Figure 6C:
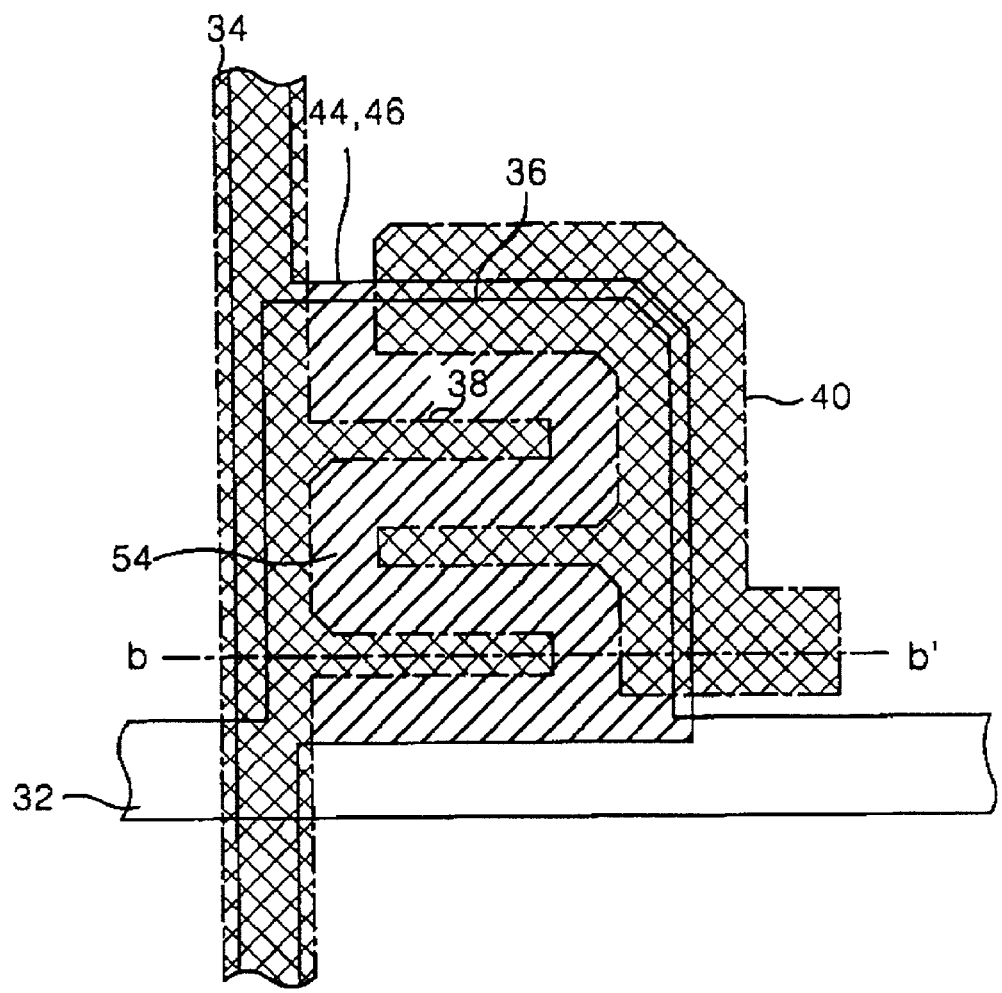
Figure 6C:
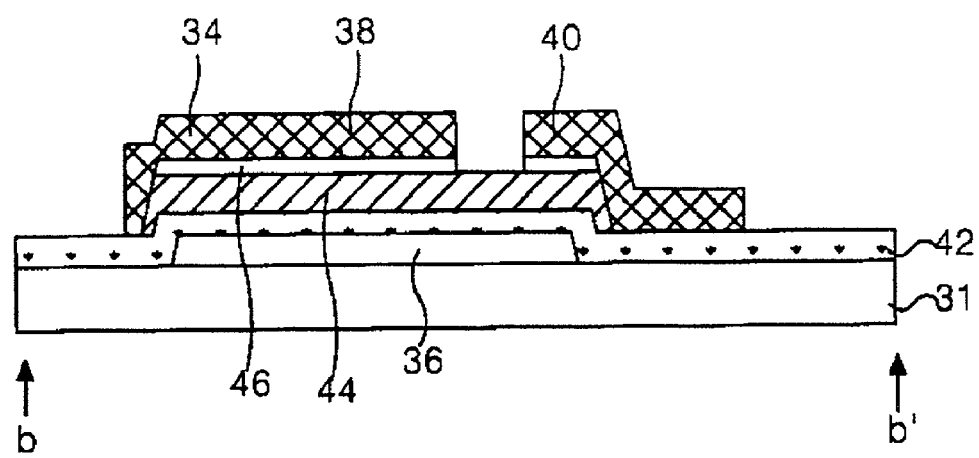

Referring now to FIG. 6C, the data line 34, the source electrode 38, and the drain electrode 40 are then provided on the gate insulating film 42. The data line 34 and the source and drain electrodes 38 and 40 are beneficially comprised of chrome (Cr) or molybdenum (Mo). The data line 4 and the source and drain electrodes 38 and 40 are formed by first depositing a metal layer (i.e., Cr or Mo) using chemical vapor deposition or sputtering. The deposited metal layer is then photolithographically patterned to produce the data line 34, the source electrode 38, and the drain electrode 40. As shown, the source and drain electrodes each have at least one protrusion that extends toward the other electrode, and the the protrusions of the source electrode is paralle to and offset from the protrusions of the drain electrode. The protrusions of the source electrode 38 that extend directly from the data line 34 are formed within the area of the active layer 44, as shown in FIGS. 4 and 6C. After the source and drain electrodes 38 and 40 were formed, the ohmic contact layer 46 over the gate electrode 36 is patterned to expose the active layer 44. The area over the gate electrode 36 between the source and drain electrodes 38 and 40, including the protrusions, forms a channel 54 having the shape shown in FIG. 5.

Figure 6D:
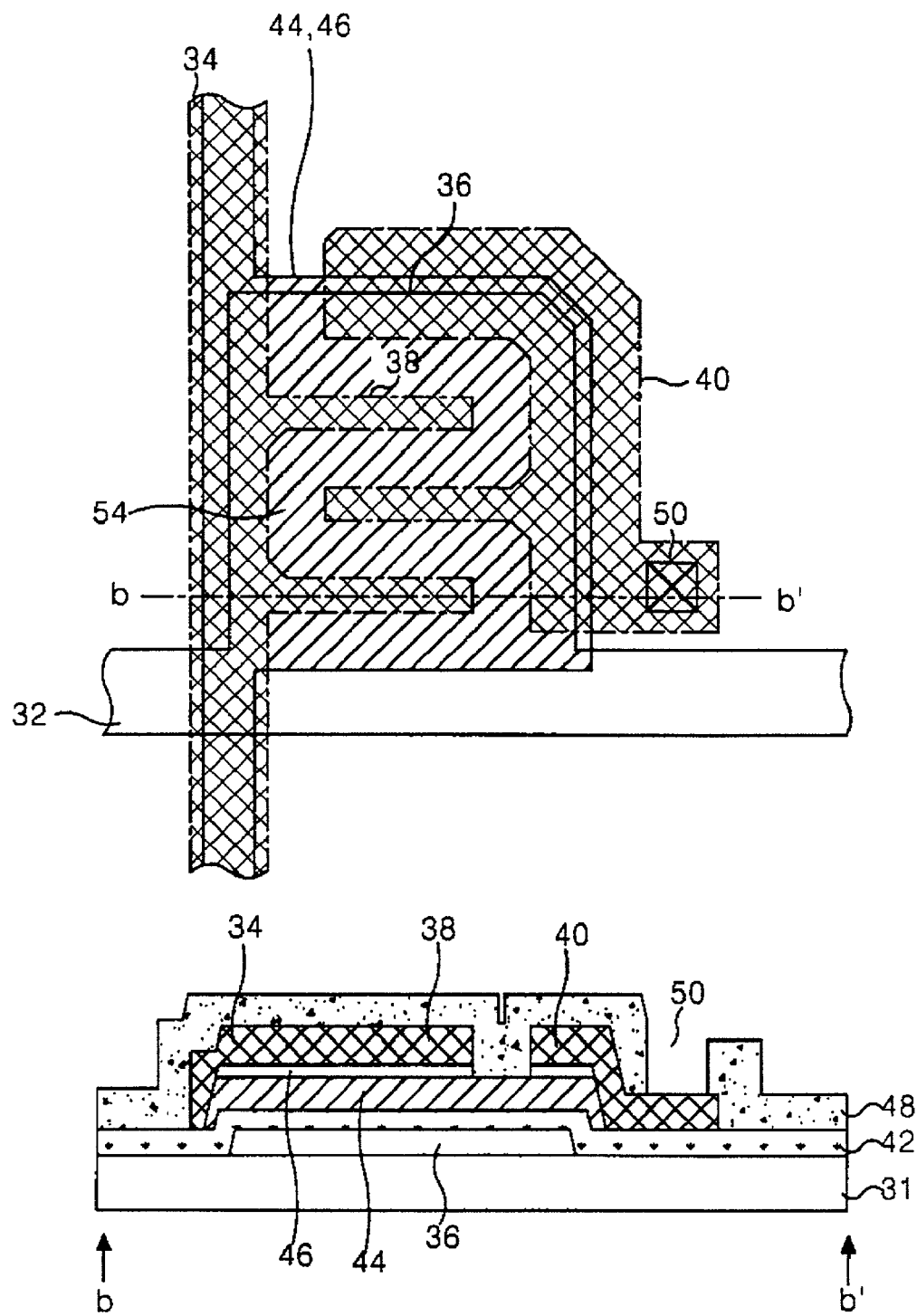

Referring now to FIG. 6D, a protective layer 48 and a contact hole 50 are then provided on the gate insulating layer 42. The protective layer 48 is formed by depositing an insulating material on the gate insulating layer 42 in such a manner as to cover the exposed structure. The hole 50 is then formed by patterning the protective layer so as to expose the drain electrode 40. The protective layer 48 is beneficially comprised of an inorganic insulating material, such as silicon nitride ($SiN_x$) or silicon oxide ($SiO_x$), an acrylic organic compound or an organic insulating material having a small dielectric constant such as Teflon, BCB (benzocyclobutene), Cytop or PFCB (perfluorocyclobutane).

Figure 6E:
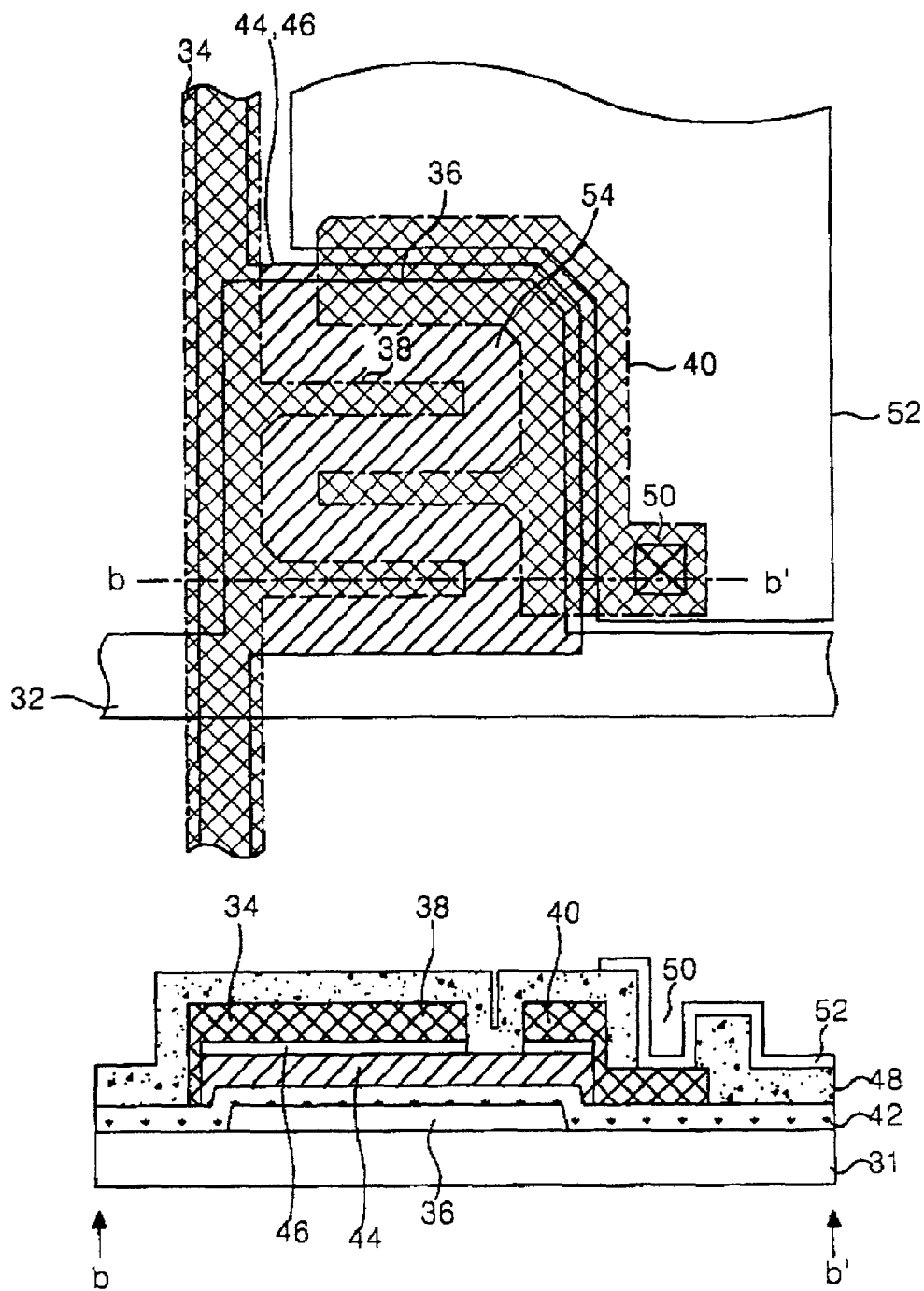

Referring now to FIG. 6E, a pixel electrode 52 is then formed on the protective layer 48. The pixel electrode 52 is formed by depositing a transparent conductive material, such as indium-tin-oxide (ITO), indium-zinc-oxide (IZO) or indium-zinc-oxide (ITZO), on the protective layer 48 and into the contact hole 50. That transparent conductive material is then patterned to produce the pixel electrode 52. Significantly, the pixel electrode 52 is electrically connected, via the contact hole 50, to the drain electrode 40.

As described above, according to the principles of the present invention, protrusions from source and drain electrodes form a TFT channel into a "ㄹ" pattern. Accordingly, the width of the gate electrode is enlarged over that of a comparable prior art TFT. When a photo resist pattern for such a gate electrode is provided, the uniformity of the photo resist pattern can be improved, which reduces defects in the gate electrode, and thus improves manufacturing throughput. Also, a display according to the principles of the present invention can have an increased aperture ratio.

Furthermore, as the overlap of a gate electrode and a data line is decreased, a parasitic capacitance Cgs is decreased. Accordingly, flicker and residual images can be reduced, resulting in an improved picture quality. Furthermore, the switching times of the TFTs can be reduced, enabling higher quality, large-dimension LCDs.

While the foregoing has generally described the principles of the present invention in relation to a standard LCD, those principles are also applicable to other types of LCDs, such as ferroelectric liquid crystal (FLC) displays.

Although the principles of the present invention has been illustrated using a particular embodiment shown in the drawings, it should be understood to the ordinary skilled person in the art will recognize that those principles are not limited to the illustrated embodiment, but rather that various changes, modifications, and adaptations are possible without departing from the spirit of the invention. Accordingly, the scope of the invention shall be determined only by the appended claims and their equivalents.

What is claimed is:

1. A liquid crystal display device, comprising:
    a gate electrode on a substrate;
    a gate insulating film on the substrate and over the gate electrode;
    a semiconductor layer on the gate insulating film and over the gate electrode; wherein the semiconductor layer includes a "ㄹ"-shaped channel having a width/length ratio of about 8.3 to about 25;
    a source electrode and a drain electrode on the semiconductor layer and adjacent the gate electrode, wherein the source electrode and the drain electrode oppose each other and each includes at least one protrusion that extends toward the opposing electrode, and the at least one protrusion of the source electrode extends directly from a data line;
    a protective layer on the gate insulating film and over the source and drain electrodes; and
    a pixel electrode on the protective layer, the pixel electrode electrically connected to the drain electrode via a contact hole;
    wherein an entire area of the "ㄹ"-shaped channel is formed over the gate electrode, the gate electrode underlies a part of the data line, the source electrodes and a part of the drain electrode so that the "ㄹ"-shaped channel is formed at parts of the source and drain electrodes facing the protrusion, the at least one protrusion of the source electrode is formed within the area of the semiconductor layer and is parallel to and offset from the at least one protrusion of the drain electrode.

2. The liquid crystal display device as claimed in claim 1, wherein the semiconductor layer includes:
    an active layer on the gate insulating film; and
    an ohmic contact layer on the active layer.

3. The liquid crystal display device as claimed in claim 2, wherein the ohmic contact layer includes an "ㄹ"-shaped opening that corresponds to the shape of the channel.

4. The liquid crystal display device as claimed in claim 2, wherein the active layer is undoped silicon.

5. The liquid crystal display device as claimed in claim 2, wherein the ohmic contact layer is doped silicon.

6. The liquid crystal display device as claimed in claim 1, wherein the channel has a width greater than 50 μm.

7. The liquid crystal display device as claimed in claim 1, wherein the pixel electrode contacts the drain electrode through an opening in the protective layer.

8. The liquid crystal display device as claimed in claim 1, further including a data line in electrical communication with the source electrode.

9. A method of fabricating a liquid crystal display device, comprising:
    forming a gate electrode on a substrate;
    forming a gate insulating film on the substrate and over the gate electrode;
    forming a semiconductor layer on the gate insulating film and over the gate electrode wherein the semiconductor layer forms a "ㄹ"-shaped channel having a width/length ratio of about 8.3 to about 25;
    forming a source electrode and drain electrode on the semiconductor layer, wherein the source and drain electrodes oppose each other and each includes at least one protrusion that extends toward the opposing electrode, and the at least one protrusion of the source electrode extends directly from a data line;

forming a protective layer over the source and drain electrodes and over a portion of the gate insulating film; and forming a pixel electrode on the protective layer, wherein the pixel electrode is electrically connected to the drain electrode via a contact hole;

wherein an entire area of the "ᄅ"-shaped channel is formed over the gate electrode, the gate electrode underlies a part of the data line, the source electrodes and a part of the drain electrode so that the "ᄅ"-shaped channel is formed at parts of the source and drain electrodes facing the protrusion, the at least one protrusion of the source electrode is formed within the area of the semiconductor layer and is parallel to and offset from the at least one protrusion of the drain electrode.

10. The method as claimed in claim 9, wherein forming a semiconductor layer includes:

forming an active layer on the gate insulating film; and forming an ohmic contact layer formed on the active layer.

11. The method as claimed in claim 9, wherein forming an ohmic contact layer produces a "ᄅ"-shaped opening that corresponds to the shape of the channel.

12. The method as claimed in claim 10, wherein the active layer is formed from undoped silicon.

13. The method as claimed in claim 10, wherein the ohmic contact layer is formed from doped silicon.

14. The method as claimed in claim 9, wherein the channel is formed with a length greater than 50 μm.

15. The method as claimed in claim 9, wherein the channel is formed only over the gate electrode.

16. The method as claimed in claim 9, wherein forming a protective layer includes forming an opening that exposes the drain electrode.

17. The method as claimed in claim 16, wherein forming a pixel electrode include forming the pixel electrode in electrical communication with the drain electrode.

* * * * *